United States Patent
Hahn et al.

[11] Patent Number: 6,147,356
[45] Date of Patent: Nov. 14, 2000

[54] ARRANGEMENT FOR THE DETECTION OF DISK-SHAPED OBJECTS IN A CASSETTE

[75] Inventors: Burkhard Hahn; Siegfried Belke; Steffen Loesch, all of Jena, Germany

[73] Assignee: Jenoptik Aktiengesellschaft, Jena, Germany

[21] Appl. No.: 09/263,618

[22] Filed: Mar. 5, 1999

[30] Foreign Application Priority Data

Mar. 30, 1998 [DE] Germany .......................... 198 14 046

[51] Int. Cl.⁷ ................................................. G01N 21/86
[52] U.S. Cl. .................................. 250/559.29; 250/559.3; 250/559.36; 250/559.4
[58] Field of Search ........................ 250/559.29, 559.3, 250/559.36, 559.4; 414/936, 937, 938, 939

[56] References Cited

U.S. PATENT DOCUMENTS

| | | | |
|---|---|---|---|
| 4,786,816 | 11/1988 | Ohmori et al. | 250/561 |
| 4,994,666 | 2/1991 | Higgison et al. | 250/222.2 |
| 5,225,691 | 7/1993 | Powers et al. | 250/561 |
| 5,266,812 | 11/1993 | Mokuo | 250/561 |
| 5,308,993 | 5/1994 | Holman et al. | 250/561 |
| 5,319,216 | 6/1994 | Mokuo et al. | 250/561 |
| 5,418,382 | 5/1995 | Blackwood et al. | 250/561 |
| 5,466,945 | 11/1995 | Brickell et al. | 250/559.12 |
| 6,052,913 | 4/2000 | Kaneko | 33/645 |

FOREIGN PATENT DOCUMENTS 2327122 7/1997 United Kingdom .
WO/9419821 9/1994 WIPO .

*Primary Examiner*—Georgia Epps
*Assistant Examiner*—Michael A. Lucas
*Attorney, Agent, or Firm*—Reed Smith Shaw & McClay, LLP

[57] ABSTRACT

An arrangement for the detection of disk-shaped objects in a cassette preferably for detecting the presence and the position of semiconductor wafers in a cassette is disclosed. Reliable detection of disk-shaped objects in cassettes is provided regardless of their orientation or any discontinuity in their edge region. This is done by an arrangement by detecting light reflected at the edges of the objects in that it has at least two linearly elongated rows of light sources which are arranged parallel to a family of planes predetermined by the cassette shelves and objects and which lie in a surface parallel to the edge areas to be detected. Further, an objective is arranged between the parallel linear light sources and by which a plurality of shelves is imaged simultaneously on the sensor unit. There can be read out of the array of sensor elements at least portions of an edge area of the objects which is elongated transversely to such an extent that, when imaged in the sensor plane, an irregularity present in the edge area of the object is always less than the read out portions of the elongated edge area.

17 Claims, 9 Drawing Sheets

ARRANGEMENT FOR THE DETECTION OF DISK-SHAPED OBJECTS IN A CASSETTE

BACKGROUND OF THE INVENTION a) Field of the Invention

The invention is directed to an arrangement for the detection of disk-shaped objects in a cassette, preferably for detecting the presence and the position of semiconductor wafers in a cassette with a plurality of shelves of identical size. It is applied particularly in the semiconductor industry for sensing the loading state of cassettes between individual technical steps in chip fabrication, preferably before, during or after access by a handling system.

b) Description of the Related Art

When processing disk-shaped objects, that is, substrates such as semiconductor wafers for the fabrication of integrated circuits, the substrates are generally arranged together by groups in cassettes, as they are called, so that they can be handled by automatic equipment. Because of the large number of technical steps which render semiconductor wafers of the type mentioned above expensive, damage resulting in unusable substrates due to errors in the handling of the substrates, for example, by double occupancy of a cassette shelf (omission of a processing step), empty shelves (carrying out the same processing step twice for the preceding or following shelf) and slanted positioning of substrates over two or more shelves (mechanical damage) should be excluded or minimized. Further, the handling system can work more efficiently and wasted routines can be prevented through exact knowledge of the actual positions of the semiconductor wafers.

A device with a purpose such as that mentioned above is known from U.S. Pat. No. 5,418,382. This device has illumination which is elongated in a slit-shaped manner and which is arranged along the stack of wafers in the vicinity of the edges of the wafers, a linear light sensor arranged in the same direction and optical transmission elements which, in the form of a number of light conducting rods, transmit the light reflected by the edges of the wafers onto the sensor lines which are set back relative to the illumination.

This simple construction is disadvantageous in that, on the one hand, a discontinuity present in the edge of a wafer for technical reasons, that is, the notch for detecting the orientation of the wafer, poses a severe problem for detection of the presence of a wafer because this notch "swallows" virtually all of the light of the slit-shaped illumination so that the sensor indicates the absence of a wafer and the omission of a processing step can accordingly lead to unusable wafers.

Further, since its edge is usually rounded in a standardized manner, a wafer exhibits a small component of specular reflected illumination light and, in the case of substrates having edges of optional or unknown quality (polished edges, rough edges or edges rounded in an indefinite manner), changing reflection behavior must even be taken into account. On the other hand, in the above-mentioned solution this results in the disadvantage that the optical transmission elements must advance very close to the edge of the wafer. However, it is desirable to maintain openness in this location to enable access of the handling system without the need for temporally and spatially separate optical detection.

OBJECT AND SUMMARY OF THE INVENTION

It is the primary object of the invention to provide a novel possibility for detecting disk-shaped objects in cassettes with a plurality of shelves so that objects in a cassette can be reliably detected regardless of their orientation or any discontinuity in their edge region. Further, along with reliable detection, sufficient free space is maintained in front of the openings of the cassette shelves at the same time for the access of a handling system without the need for mechanically removing or swiveling the optical arrangement.

According to the invention, in an arrangement for the detection of disk-shaped objects in a cassette comprising a plurality of shelves with an illumination unit whose light is directed to reflecting edge areas of the objects which are visible at openings of the shelves of the cassette, at least one optical system for the transmission of light which, proceeding from the illumination unit, has been reflected in at least one edge area, a sensor unit having at least one linear array of light-sensitive sensor elements which is oriented vertical to the direction of the shelves and of the disk-shaped objects and which converts the light reflected by the edge areas of the objects into electrical signals, and an evaluating unit for determining the presence and the position of objects in the shelves of the cassette, the above-stated object is met in that the illumination unit has at least two linearly elongated rows of light sources which are arranged parallel to a family of planes predetermined by the shelves and objects and which lie in a surface parallel to the edge areas to be detected, in that the optical system is an objective which is arranged between the parallel rows of light sources and by means of which a plurality of cassette shelves is imaged simultaneously on the sensor unit, and in that there can be read out of the array of sensor elements at least portions of an edge area of the objects which is elongated transversely to such an extent that, when imaged in the sensor plane, unevenness present in the edge area of the object is always less than the read out portions of the elongated edge area.

The linear rows of light sources which are arranged parallel to the family of planes of the cassette shelves are arranged symmetric to the objective in pairs. In a preferred variant, luminescent diode lines are used as light sources.

The surface in which the parallel rows of light sources are arranged is advisably spanned or plotted by parallel straight lines which are parallel to surface lines of a circular cylinder generated by an orderly stack of objects located in the cassette. A plane parallel to the tangential plane tangent to the circular cylinder generated by an orderly stack of objects in the cassette is advantageously selected as the surface for arranging the rows of light sources. However, a cylindrical generated surface arranged parallel to the above-mentioned circular cylinder is also suitable as a surface for arranging the parallel rows of light sources.

It has proven advantageous that the parallel rows of light sources and the principal plane of the objective are arranged in the same surface. This is especially important because, from a design perspective, the illumination, objective and sensor array are advantageously comprised in a compact sensor component group.

A mean surface normal which coincides with the optical axis of the objective and is at the same time the axis of symmetry for the arrangement of the rows of light sources is advisably associated with the surface in which the parallel rows of light sources are arranged, wherein this mean surface normal advantageously encloses an angle other than zero with the surface normals of a plane spanned by the openings of the cassette shelves, wherein this angle is large enough that a free space remains open in front of the openings of the shelves for the insertion and removal of objects.

There are a number of variants suitable for reading out a suitable portion of the transversely elongated edge area of the objects from the sensor array.

For one, it is advisable that at least two parallel rows of pixels can be read out of the array of sensor elements, wherein at least two of the read out rows of pixels have a spatial distance from one another such that an irregularity to be taken into consideration in the edge area of the object when imaged in the sensor plane is always smaller than this spatial distance. This can be realized in an advantageous manner in that the different rows of read out pixels are generated one after the other with respect to time by an individual linear array of sensor elements, wherein the sensor array is moved vertical to its longitudinal extension between the readouts of the different rows of pixels. For this purpose, the sensor array is preferably mounted on a piezo-electric displacement element. In another possible arrangement for generating different rows of read out pixels, two separate sensor lines or a two-dimensional sensor array are or is advantageously provided, wherein not necessarily all of the read out pixel rows are included in the evaluation.

On the other hand, sufficient portions of the transversely extending edge area can be read out of a sensor array when the sensor array is a linear sensor array with a large transverse aperture, i.e., with a high aspect ratio of the sensor elements, e.g., a CCD line of the SC series by EG & G Reticon with sensor element surfaces of 2.5 mm*25 $\mu$m (aspect ratio 100:1).

Means for eliminating signal dropout occurring as a result of known irregularities in the object edges are advantageously included in the evaluating unit, wherein these means correlate the object signals of at least two read out rows of pixels which are at a sufficient distance from one another in the image of the edge area and contain a logical sum for defining the presence of an object as long as there is no tolerance-exceeding difference in position of correlated object signals relative to a learned normal position of the objects. Further, means are advantageously provided in the evaluating unit for detecting slanting of the objects over at least two shelves of the cassette, wherein an appearance of a properly loaded cassette is stored in these means by learning and a reference pattern is provided by means of calculating defined areas of cassette shelves in which an object can actually be located, wherein a slanted position can be detected by means of this reference pattern through a comparison of these defined areas with the object signals of the imaged edge areas when at least one object signal is detected outside of this defined area.

It has proven particularly advantageous, not exclusively when using a sensor line with a large transverse aperture, to provide means in the evaluating unit for calculating suitable threshold values for object signals, wherein the calculation of the threshold values is based on a calibrating measurement of the light loss in the known irregularity of the object edge in the detected edge area, and for evaluating contrast maxima and contrast minima by applying a spacing criterion provided by reference patterns.

In order to enable disk-shaped objects to be detected by the invention in cassettes of any size with different heights (wherein the height generally depends on the shelf spacing which can be 5 mm or 10 mm, for example, for different wafer sizes), it has proven advantageous to provide a multiple arrangement of the arrangement according to the invention, wherein the individual arrangements are arranged in a row along a straight line parallel to the direction of the objects stacked in the cassette.

The essential idea underlying the invention is to depart from a slit-shaped illumination in the direction of the cassette shelves and, in its place, to substitute an illumination having a large extension in the direction of the object edges to be detected, although this entails a certain nonuniformity of the illumination in the direction of the object stack. This problem is overcome by employing a large-area imaging system and a symmetric arrangement of the illumination and in that the image of broader edge areas of the objects in the sensor planes are made available in a focused manner.

Because of this widened and, at the same time, exactly geometric image of the edge areas, the arrangement according to the invention, in addition to reliably detecting the objects also in critical edge areas with a notch, makes it possible to increase the distance of the entire arrangement from the cassette opening resulting in the desired free space for unimpeded access of a handling system.

The invention will be explained more fully hereinafter with reference to an embodiment example.

DESCRIPTION OF THE PREFERRED EMBODIMENTS

Figure 1:
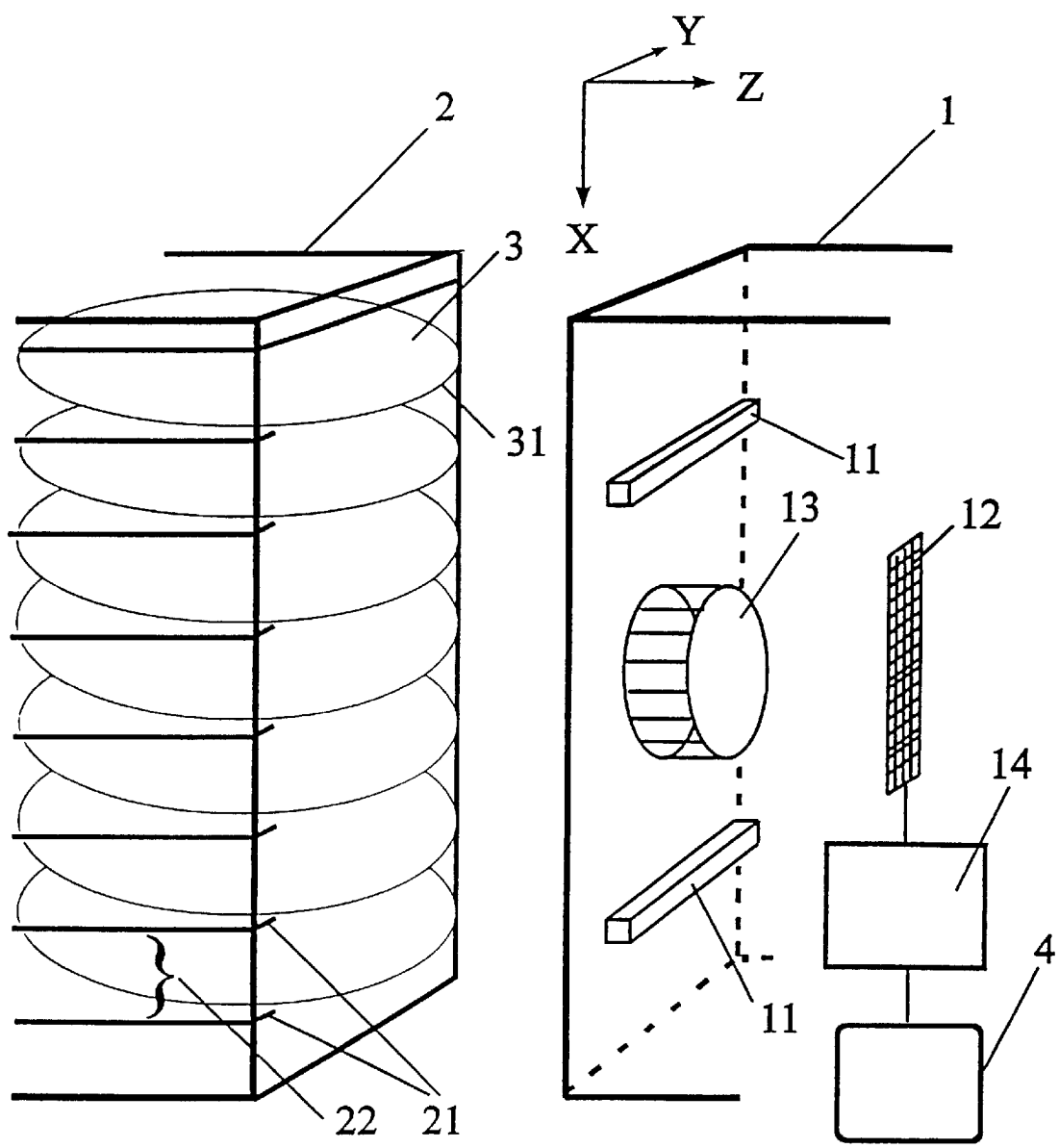
FIG. 1 shows the basic construction of an arrangement according to the invention.

FIG. 1 shows the arrangement according to the invention with at least two illumination fields 11, a sensor array 12, an objective 13, wherein the illumination fields 11 are arranged parallel to one another and symmetric to the objective 13 as linear rows of light sources, and an evaluating unit 14 arranged as a compact sensor 1.

A cassette 2 serves to receive a quantity of wafers 3 which are transported in this cassette 2 from one process step to the next in the semiconductor fabrication plant. The wafers 3 are automatically (by means of handling systems, as they are called) removed from the cassette 2, processed and then returned again to the cassette 2. The wafers 3 are stacked in the cassette 2 in an ordered manner. For this purpose, crosspieces or webs 21 are incorporated in the side walls of the cassette 2 and are located exactly opposite one another at uniform intervals and accordingly form shelves (slots) 22 in which the wafers 3 are deposited. The quantity and size of the shelves 22 (spacing of the webs 21) can vary in different cassettes 2, but are standardized for each type of cassette 2. Every wafer 3 has an identification number which also contains the number of the shelf 22 in which the wafer 3 is located.

The purpose of the compact sensor 1 is to indicate to a handling system the shelf 22 in which a wafer 3 is located. For this purpose, the sensor array 12 records a portion of the light which is reflected from the illumination fields 11 at the edges 31 of the wafers or which is scattered by the objective 13 on the sensor array 12.

The sensor array 12 is oriented in the stacking direction of the wafers 3 in the cassette shelves 22 and is divided into many individual sensor elements. Individual sensor elements accordingly receive light from a determined wafer 3 and from a determined area on the edge of this wafer 3. Each individual sensor element can be evaluated separately.

If the cassette 2 contains the maximum quantity of wafers 3 (all shelves 22 are occupied) and each shelf 22 also holds only one wafer 3, a reference map or reference image can be recorded in which all of the active sensor elements of the sensor array 12, i.e., the elements receiving the light reflected by a wafer 3, are determined. This reference image is stored in the evaluating unit 14. All rows of pixels which are recorded subsequently are compared with this reference image. If there is no wafer 3 in a shelf 22, the sensor elements allocated to this shelf 22 are not active, i.e., they do not receive light. If a wafer 3 does not occupy the same webs 21 of the cassette 2 on both sides, i.e., if it lies slanted in two shelves 22 (crossed wafer), other sensor elements from the sensor array 12 are active. This also applies to cases where two wafers 3 lie on top of one another in the same shelf 22.

Figure 2:
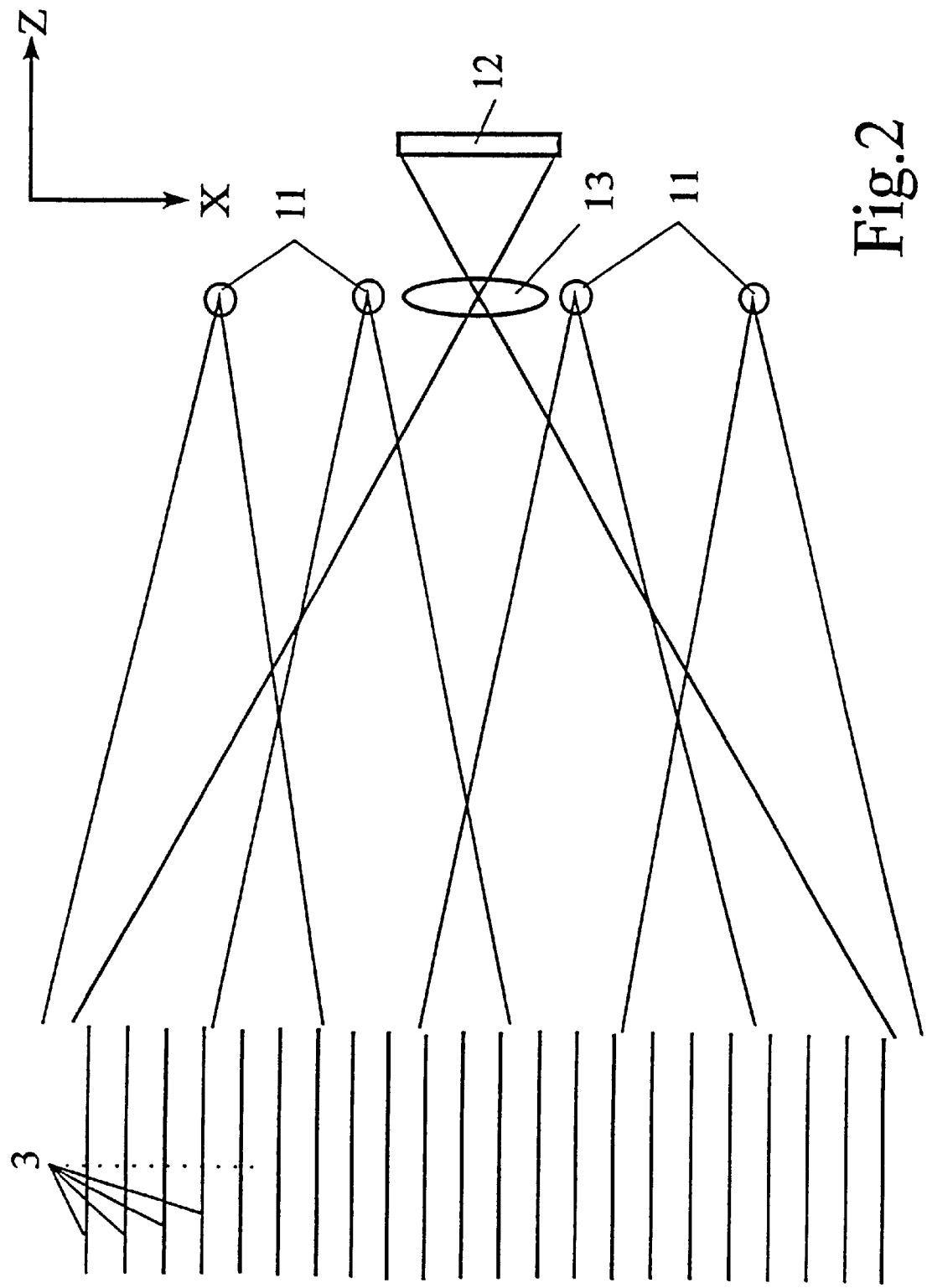
FIG. 2 shows a schematic diagram of the illumination and imaging ratios at edges of a stack of objects (wafers)

FIG. 2 shows the illumination beam path and the imaging beam path of the compact sensor 1. The aperture 15 of the illumination areas 11, wherein there are four illumination fields 11 in the present case, is dimensioned in such a way that it illuminates the schematically illustrated stack of wafers 3 in the cassette 2, not shown, as uniformly as possible in the X direction. The illumination fields 11 which extend linearly vertical to the drawing plane are arranged symmetrically in pairs with respect to the objective 13. The focal length of the objective 13 is selected in such a way that the entire stack of wafers 3 in a cassette 2 is imaged on the sensor array 12.

Figure 3:
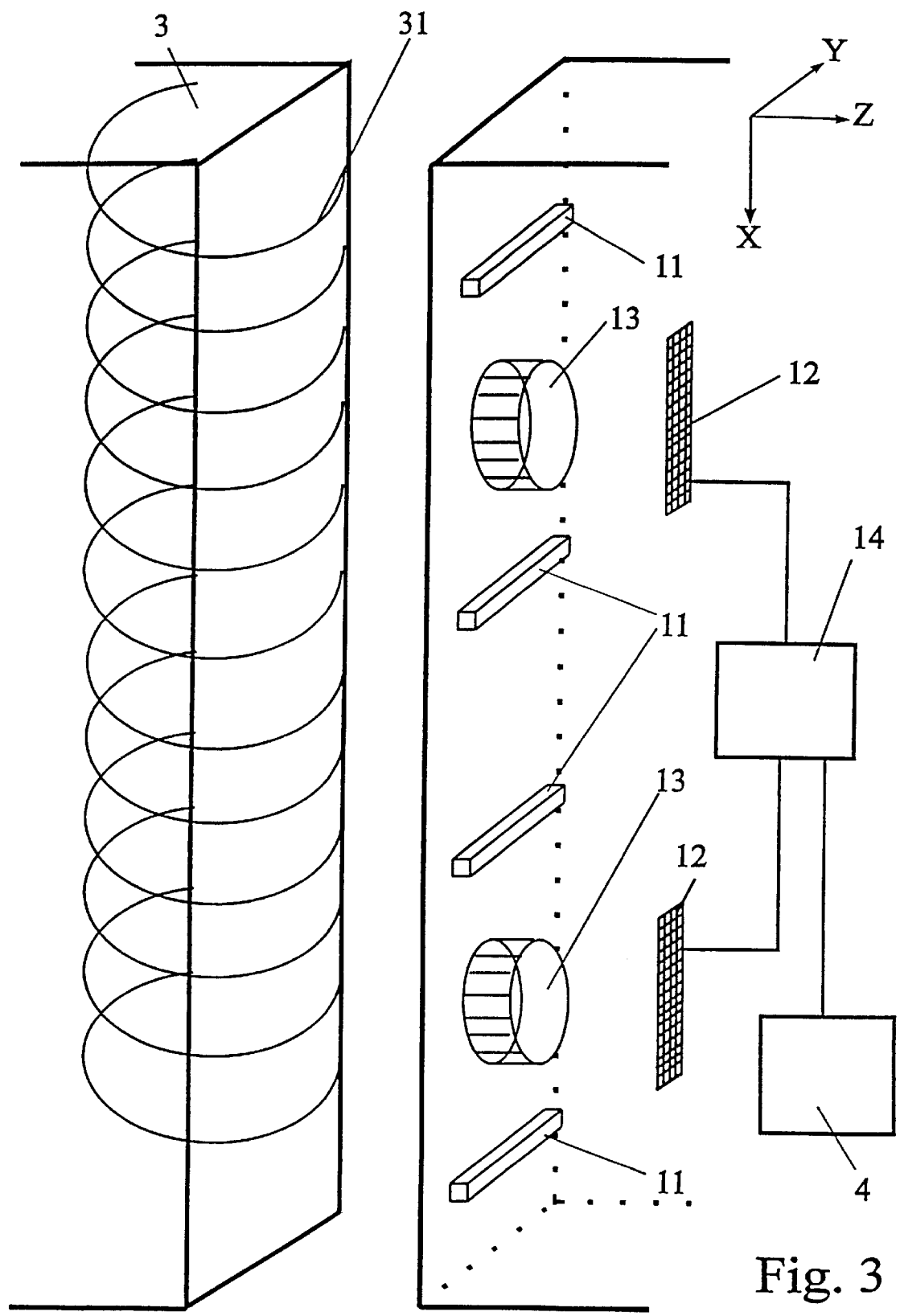
FIG. 3 shows an advantageous multiple arrangement of the compact sensor according to the invention for inspecting cassettes having a large number of shelves.

By means of duplication or multiple duplication of the above-mentioned arrangement according to FIG. 3, the occupancy of larger substrate carriers (cassettes 2) can be inspected in an economical manner. This is advantageous in that cassettes of any size can be checked with respect to their contents by a compact sensor 1 which is kept small and by its continuous stacking without complicated adjustment relative to one another. The only prerequisite for this is that the compact sensor 1 is designed in such a way with respect to its dimensions that the parallel illumination fields 11 are uniformly distributed over the entire construction. It is also possible, in contrast to FIG. 3, to carry out evaluation with a plurality of evaluating units in order to reduce the evaluation time and therefore to increase the productivity of inspection.

Figure 4:
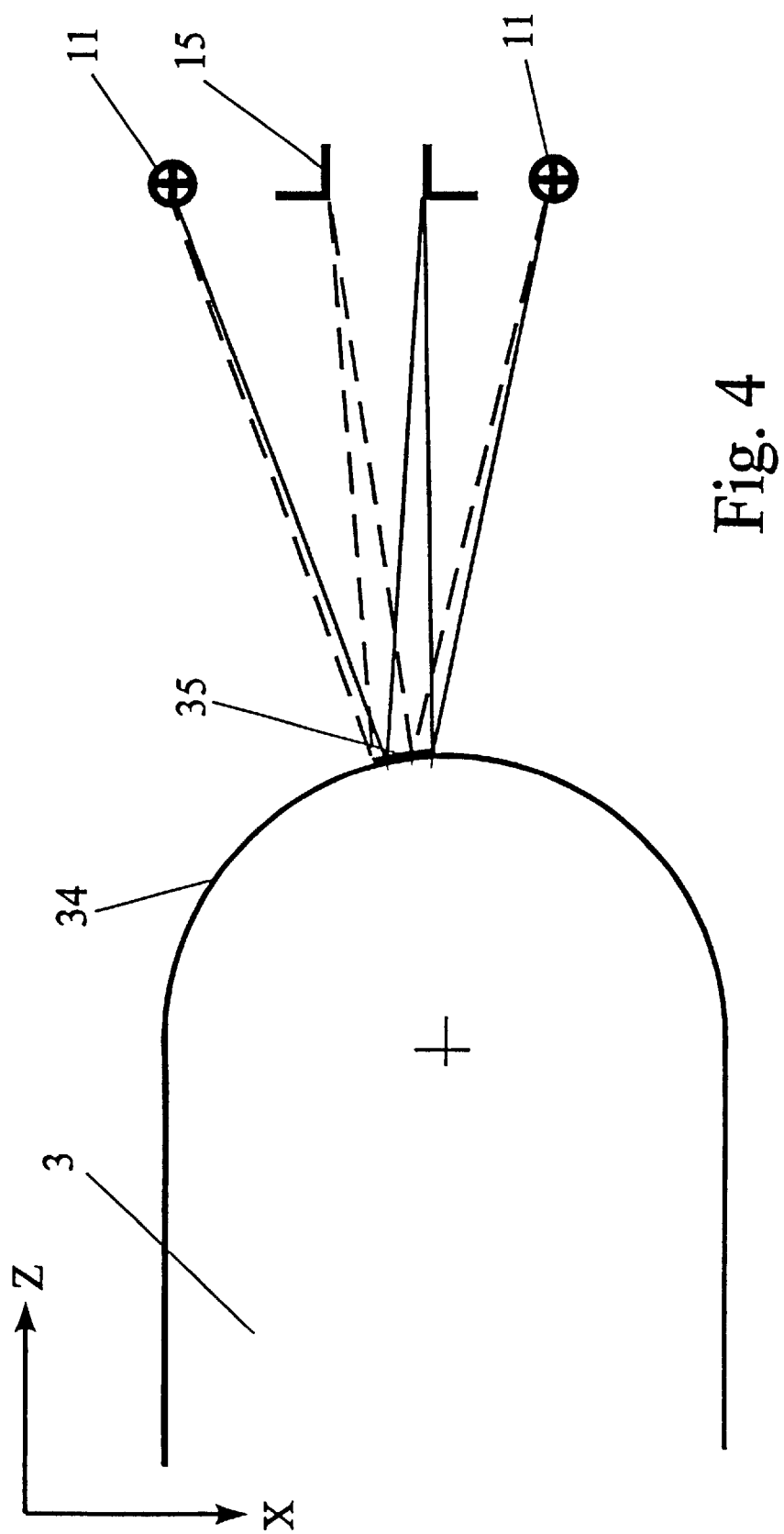
FIG. 4 shows a sectional view of a wafer to illustrate the reflection at a rounded wafer edge.

Close inspection of a wafer 3 reveals that the edge 31 of a wafer 3 is founded in a standardized manner. FIG. 4 shows an edge 34 which is rounded in this way with an illumination beam path, shown schematically. Because of the rounded edge 34, there is, for each wafer position in the cassette 2, only a small vertical area 35 in the direction of thickness of the wafer from which directly (specular) reflected light can be received from both illumination fields 11. This area 35 increases as the aperture 15 of the objective 13 increases. This relationship is true regardless of the actual shape of the rounded edge 34 so long as the rounding assumes a constant course, i.e., the shape of the rounded edge 34 can also assume a course deviating from the circular shape; it is only necessary that no corners occur. If the wafer edge 31 is not polished, which is often the case in wafers 3, light is scattered away from the wafer edge 34 with a varying degree of diffusion. Light beams can also enter the aperture 15 of the objective 13 from the vicinity of the vertical region 35. The principle of wafer detection does not affect this.

Figure 5:
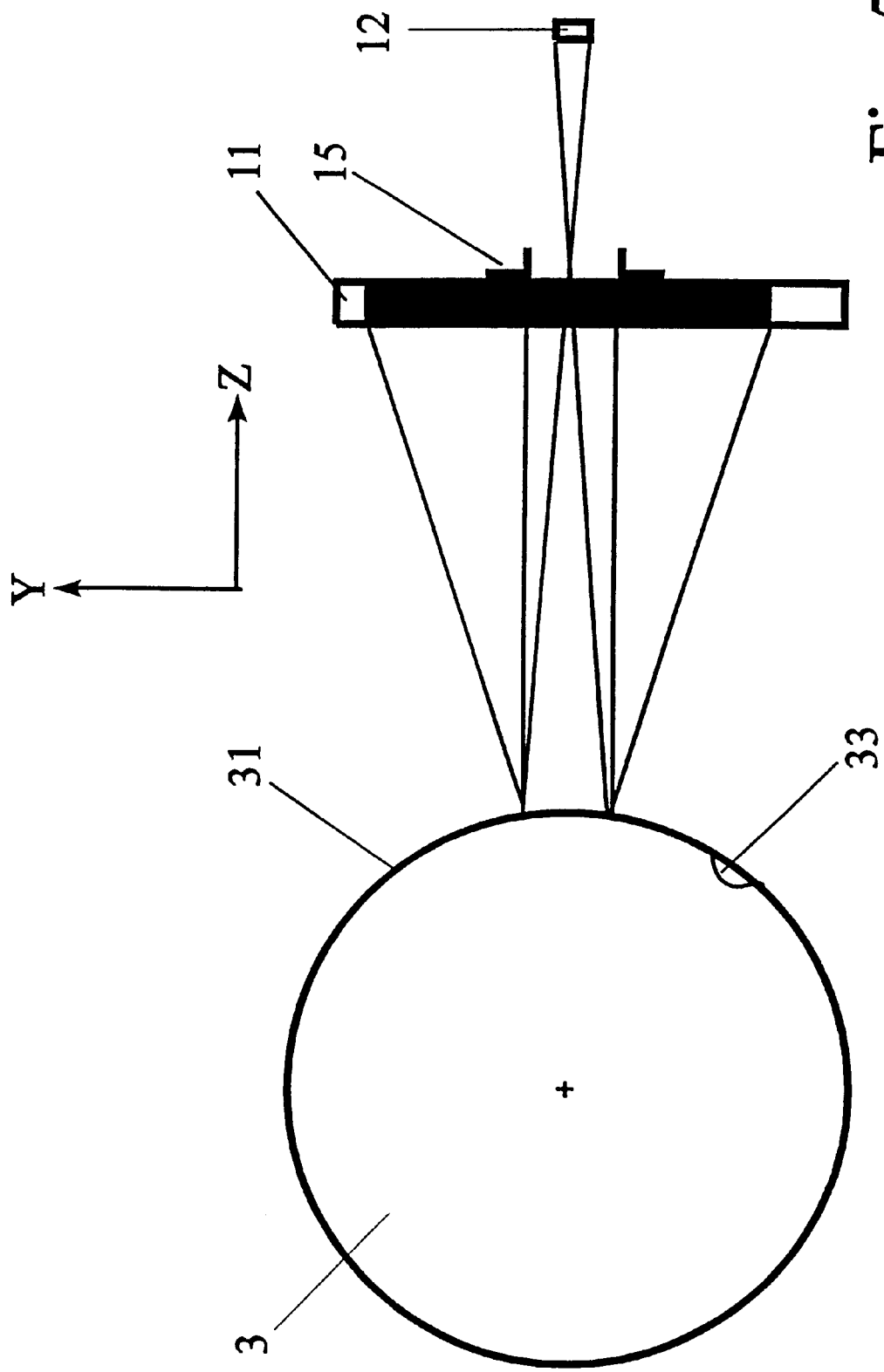
FIG. 5 shows a schematic diagram of the illumination and imaging, according to the invention, of a wafer edge in the direction of the wafer circumference.

FIG. 5 shows the imaging beam path in a top view of the cassette 2. The linear elongation of the illumination field 11 in the Y direction (parallel to the planes of the wafers 3) determines the amount of reflected light that is allowed through the aperture 15 of the objective 13 to the sensor array 12 from the edge area 32 at the circumference of the wafer 3 (as circular disk). When light from the illumination field 11 is received through direct reflection from this imaged edge area 32, the illumination field 11 must extend in the Y direction such that for every point from the edge area 32 there is a point on the illumination field 11 for which the law of reflection is satisfied in such a way that a direct beam can enter the aperture 15 of the objective 13 from a point of the illumination field 11 over a point on the area of the wafer edge 31. The larger the aperture 15 of the objective 13, the larger the quantity of points of the illumination field 11 for which this condition of direct reflection is met. The larger this imaged edge area 32 (corresponding to the dimensions of the illumination field 11), the stronger the signal that can be received by the sensor array 12 from a wafer edge 31. In the case of predominantly diffusely scattering wafer edges 31, light from the entire width of the illumination field 11 can enter the aperture 15 of the objective 13 in principle. This is dependent only on the magnitude of the scattering indicatrix of the wafer edge 31 which can assume values from 0° to 180° in principle.

In order to determine the orientation of a wafer 3 with respect to rotation about its center, this wafer 3 is provided with a standardized cutout or notch 33. It has been determined by experiments that no light reaches the aperture 15 of the objective 13 from the area of the notch 33 (compare also position B in FIG. 8). In this case, a sensor according to the prior art would lead to an erroneous interpretation, i.e., it would report the absence of a wafer 3 although a wafer 3 is present. A wafer position of this kind is shown in FIG. 6 (although in connection with the invention).

Figure 6:
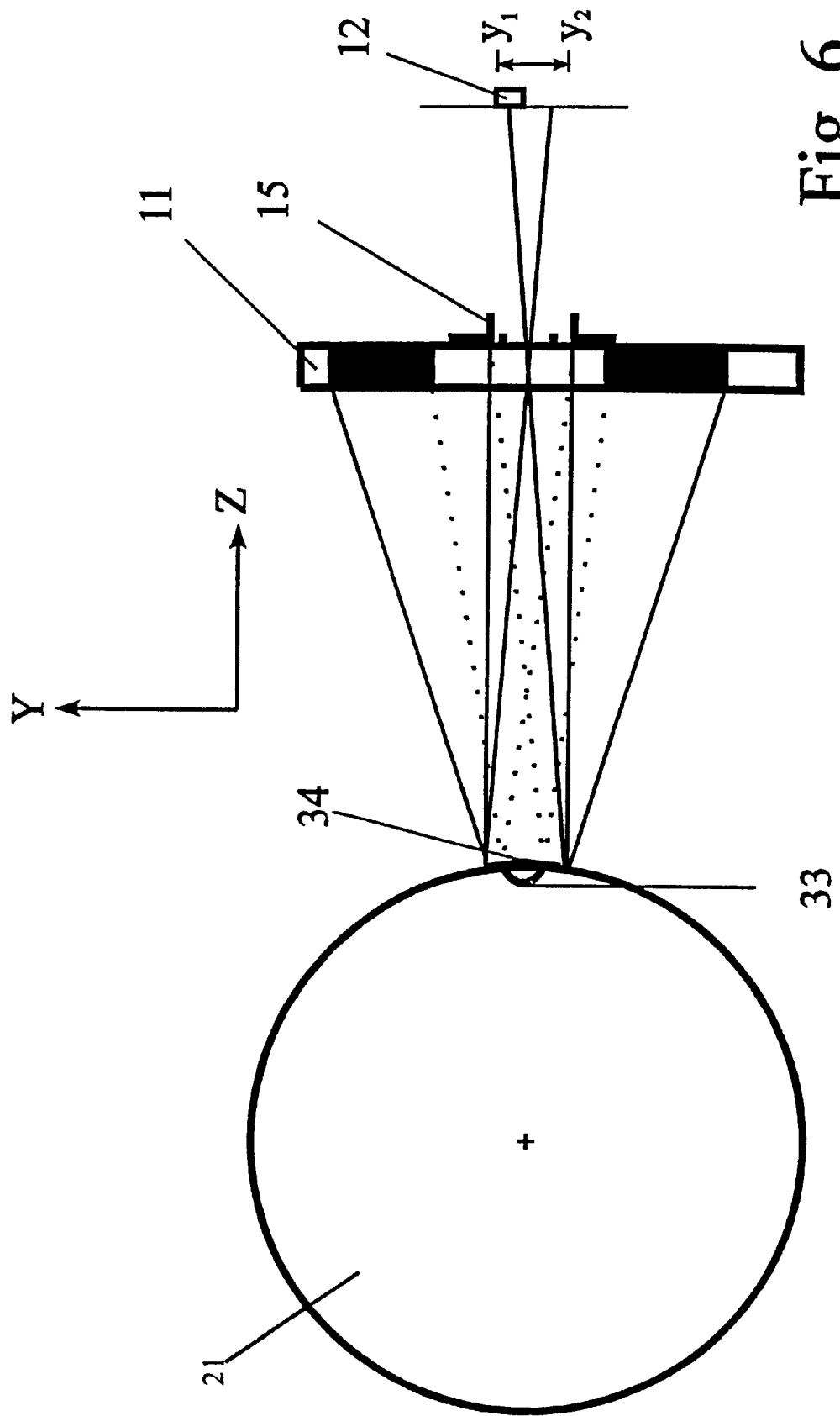
FIG. 6 shows a schematic diagram of the illumination and imaging of a wafer edge with a notch.
Figure 8:
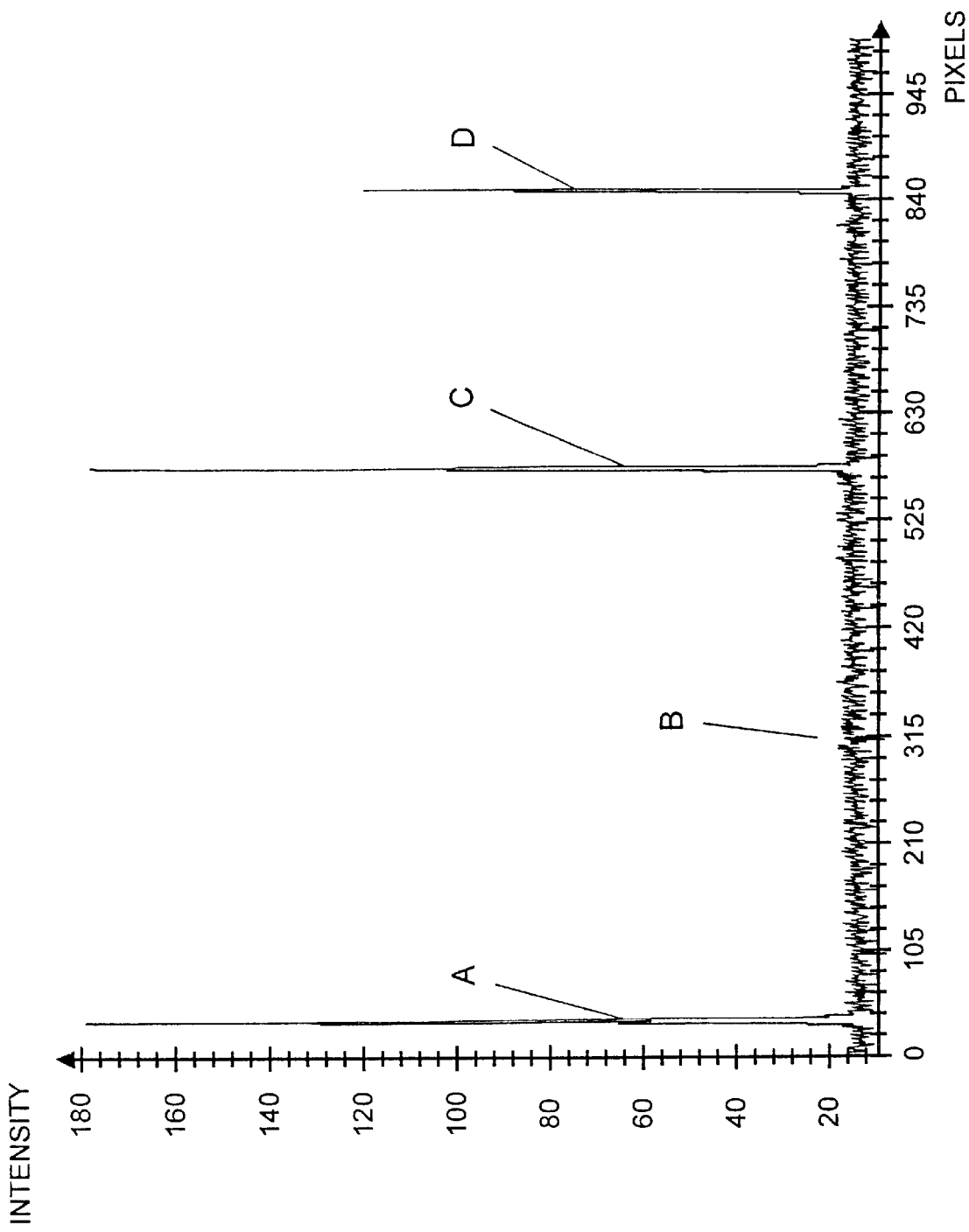
FIG. 8 shows an excerpt from the intensity profile of a pixel row with four wafer images, one of which is missing (according to the prior art) in the imaged edge area due to the presence of a notch.

In addition, FIG. 8 shows a section from the signal field of a sensor such as that given for a sensor according to the prior art in the wafer positions shown in FIGS. 5 and 6. The section shows the sensor signal for the presence of three wafers 3 lying in shelves 22 in positions A, C and D. Only in position B was the notch 33 of a wafer 3 rotated into the visual field of the sensor array 12. The sensor signal for this wafer 3 decreases drastically and, in the case of this measurement according to the prior art, results in an erroneous decision that no wafer 3 is present in position B.

The illumination and imaging ratios according to the invention which are shown in FIG. 6 are suitably configured to prevent an erroneous interpretation of the sensor signal when a notch 33 is present. FIG. 6 shows a top view of the stack of wafers 3, so that the drawing plane lies in a wafer plane designated as the Y-Z plane. Light from the illumination fields 11, only one of which is shown since only the Y component of the illumination and imaging are to be considered in the present case, impinges on a portion of the wafer edge 31.

In order that increased illumination in the Y direction can also be utilized, determined requirements must also be imposed on the sensor array 12 and the evaluation. This problem is solved, first, in that the elongation of the sensor array 12 in the Y direction is greater than the image of the notch 33 on the sensor array 12. In this case, there are always portions of the edge area 32 from which light arrives on the sensor array 12. In principle, this can be carried out in different but equivalent ways.

First, the sensor array 12 can be a conventional CCD line which is movable in the Y direction in that it is displaced with respect to position by a piezoelectric displacing unit in order to read out a row of pixels successively in time in at least two different locations of the image of the edge area 32. The same result is obtained when two sensor lines are arranged in a stationary manner in the end positions of the above-described displacement movement. Secondly, the sensor array 12 can be constructed as a two-dimensional matrix as is indicated in FIG. 1 and, thirdly, it is also sufficient to use a special CCD line with a large transverse aperture is used, i.e., a line having a high aspect ratio such as, e.g., CCD lines of the SC series by EG&G Reticon with an aspect ratio of 100:1 (edge lines of the sensor elements of 2.5 mm to 25 $\mu$m). For this latter variant which is shown in FIG. 5, the actual construction of the compact sensor 1 includes an objective 13 (with a focal length of 35 mm and with an aperture of 5.6) and a linear sensor array 12 in the X direction with 1024 pixels with a size of dx*dy=0.025 mm*2.5 mm. The imaging scale is $\beta'=-0.24$, i.e., the imaged edge area 32 is 10 mm, more than three times the standardized width of the notch 33 of approximately 3 mm. At a resolution of 0.1 mm per sensor element in the X direction, a wafer thickness is equal to approximately 6 to 7 sensor element widths.

In the first construction mentioned above, the sensor array 12 can be arranged in such a way that two sensor lines are arranged with an approximately square aperture. Thus, for example, two sensor lines of 2048 pixels each with pixel sizes of dx*dy=0.014 mm*0.2 mm can be arranged at a lateral distance of 2.5 mm relative to one another in the Y direction. Their visual fields projected on the wafer edge 31 are 0.8 mm at a distance of 10 mm, so that an object signal is always received by one or both sensor lines in any position of the notch 33.

According to FIG. 6, an individual sensor array 12 with values identical to those mentioned above is arranged in the form of a conventional CCD line with 2048 pixels and pixel sizes of dx*dy=0.014 mm*0.2 mm in such a way that displacement can be carried out from a position $Y_1$ to a position $Y_2$ by an adjusting mechanism. For example, the positions correspond to the positions of the two sensor lines from the construction mentioned above. An image of the wafers 3 in the cassette 2 is recorded separately at each of the positions $Y_1$ and $y_2$.

One option is to record an image during the movement of the sensor array from position $y_1$ to position $y_2$. The image recording period is then selected in such a way that it is equal to or is a multiple of the movement period $y_1$ to $y_2$. in the latter case, the sensor array moves repeatedly from $y_1$ to $y_2$ and back. Typical times for a displacement are 10 ms. The image recording period can be up to 40 ms. This continuous image recording at the same time enables the use of a sensor matrix as a sensor array 12 as is indicated in FIG. 1 without the invention being limited thereby.

Figure 9:
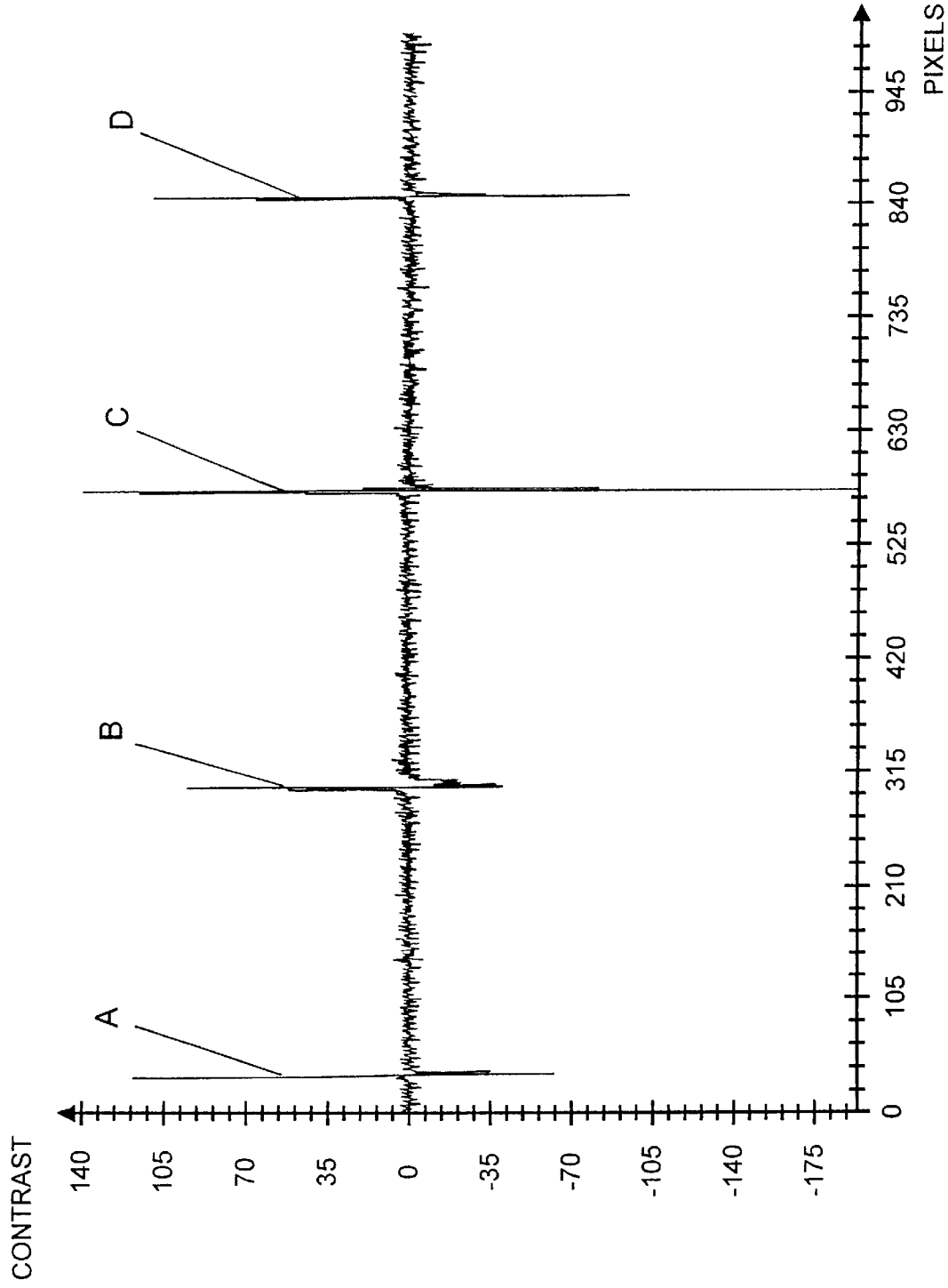
FIG. 9 shows the excerpt of the pixel row from FIG. 8 (according to the invention) with a view of a contrast value image.

The photons impinging on the sensor array 12 during the image recording period are accumulated pixel by pixel and converted into electrical signals which correspond to the sums of the generated pixel charges. The pixels are evaluated line by line. The electrical signals are converted into digital values (hereinafter, grayscale values) in the evaluating unit 14. The algorithm described in the following can be executed in its entirety in a processor (e.g., a $\mu$C or DSP) or also, in part, in real-time hardware (e.g., FPGA). The sequence of grayscale values of a sensor line is first examined on local extrema of the 0th and 1st order. Extrema of the 1st order are positive and negative peaks in the sequence of differential values (contrast value sequence according to FIG. 9).

The extrema of the 1st order define the start (contrast maximum) and the end (contrast minimum) of a sensor signal for pixels which "see" a wafer edge 31. The middle position between the positions of the contrast maximum and contrast minimum is defined as the measured position of a wafer 3 (wafer position). The contrast maximum and contrast minimum must meet two further conditions in order to be counted as wafer signal limits. In the case of the contrast maximum, this prerequisite consists in that the value of the extremum must lie above a noise threshold and there may not be any additional extrema of the 0th and 1st order standing out from the signal noise prior to this extremum within a defined interval. The value of the contrast minimum must lie below a noise threshold and, after this contrast minimum, there may not be any additional extrema of the 0th and 1st order standing out from the signal noise within a defined interval.

If a measured wafer position is located inside of an area of a cassette shelf 22 defined by learning, the corresponding shelf 22 is occupied in a regular manner.

If there is no signal that can be evaluated within the defined area, two cases present themselves for consideration: If the defined area is empty and there is no significant signal at a distance from the defined areas of the two adjacent shelves 22, there is no wafer 3 in the shelf; if the signal is not located within the defined area, but rather outside it between the defined areas of adjacent shelves 22, the wafer 3 is slanted over two or even more shelves 22.

If significantly more extrema of the 0th and 1st order are located between the start and the end of the defined area in which a wafer 3 can lie in a regular position at all, wherein this area is determined by learning with a reference cassette, then this wafer shelf 22 is occupied by more than one object.

Learning can be carried out by means of a filled cassette 2. The limiting positions (start and end) of the wafer signals are determined first. The found wafer positions are consecutively numbered by shelf number. A defined area in which the wafer 3 is normally located is then assigned to each numbered shelf 22, wherein this area is given by the wafer position +/- of a tolerance value (system value). The extrema of the 0th and 1st order found within the wafer signal are recorded by the corresponding shelf number in addition to the defined area and can then be utilized to check for multiple occupancies.

When evaluating two (or more) pixel rows (read out of a repeatedly displaced line, from separate lines or from a matrix), the results are superimposed in the following manner. If a wafer 3 has been found in a shelf 22 at least once, no multiple position is detected and this shelf 22 is then considered to be occupied by one object. If multiple occupancy has been measured in a shelf 22 at least once, this shelf 22 is considered to be occupied by multiple objects. If at least two different wafer positions have been measured, at least one of which lies between the defined areas of two shelves 22, the stored findings will indicate a wafer 3 lying slanted between these two surfaces 22.

When monitoring a wafer cassette 2, the shelf numbers of the shelves 22 whose defined areas are occupied by one or more objects are determined, and in addition, those shelves whose defined areas are located above or below slanted wafers 3 are determined. These numbers with a corresponding coding are transferred to a master unit (e.g., a computer 4) as detection results.

Figure 7:
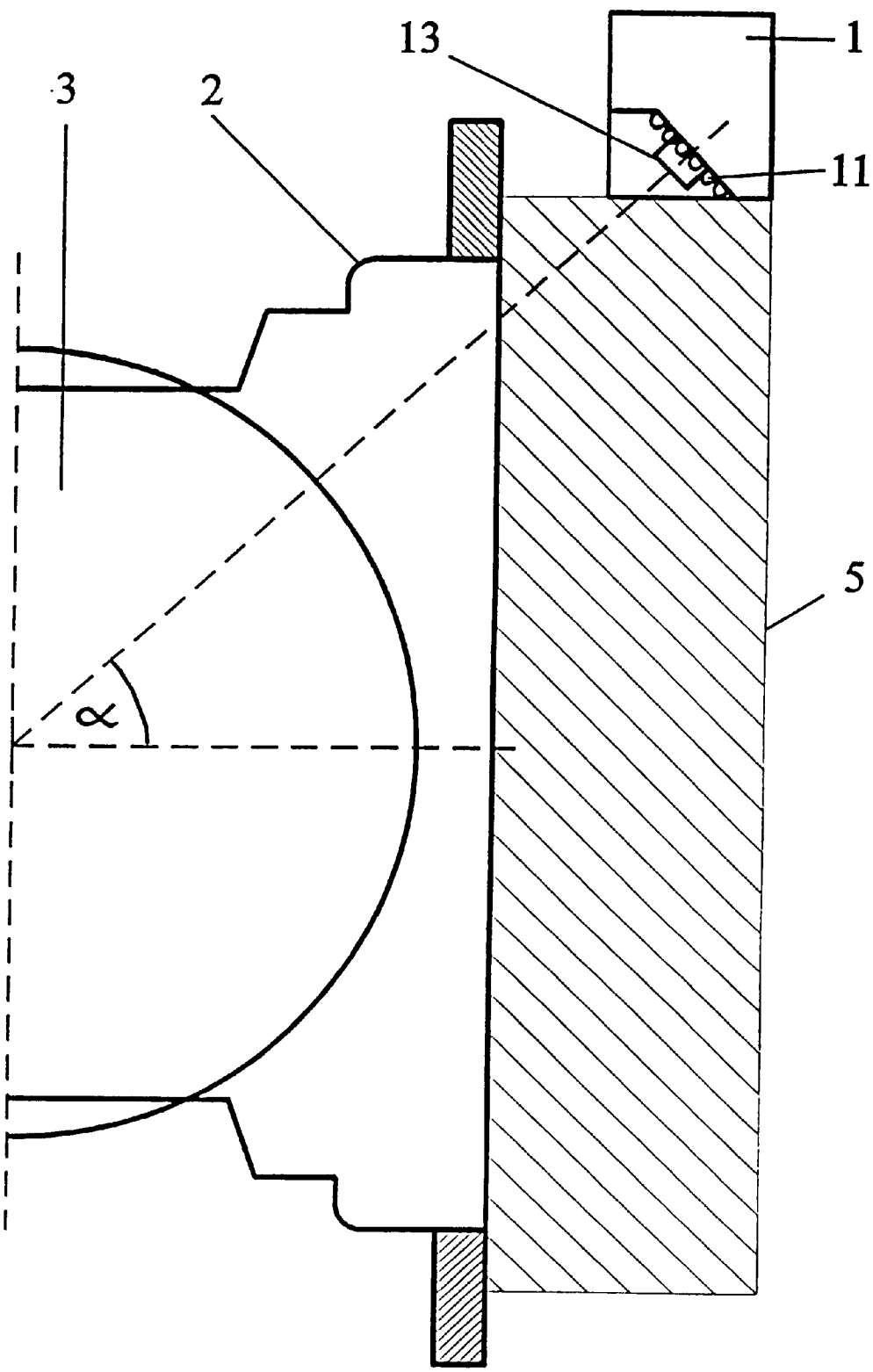
FIG. 7 shows an advantageous spatial arrangement of the compact sensor, according to the invention, with a free space for unimpeded access to the objects (wafers)

The space directly in front of the wafer cassette 2 is kept free for wafer handling. According to current standards, an inspection device located in this space at a distance of 300 mm*100 mm is not desirable. Because of its components, the arrangement according to the invention makes it possible to inspect wafers 3 laterally, with respect to the openings of the shelves 22, outside of the space prescribed for this purpose. This variant of the invention is shown in FIG. 7.

In this example, an illumination field 11 should comprise a linear row of eight light-emitting diodes (LEDs) which form an illumination field 11 of dx*dy=5 mm*40 mm. Two illumination fields 11 are arranged on both sides of the objective 13 (above and below the objective 13 with respect to the drawing plane) and have a distance of approximately 40 mm from the objective axis. The LEDs have a radiating characteristic of +/−15°. For purposes of illustration, a mean surface normal which coincides with the optical axis of the objective 13 and is, at the same time, the axis of symmetry for the arrangement of the illumination fields 11 will be assigned to the surface in which the parallel illumination fields are arranged. This mean surface normal encloses an angle $\alpha$ not equal to zero with the surface normals of a plane which is plotted by the openings of the cassette 2, wherein this angle is large enough so that a free space remains in front of the openings of the cassette 2 for the insertion and removal of objects.

The illumination of the cassette 2 can be further improved when, instead of one illumination field 11, two illumination fields 11 are used on both sides of the objective 13, all of which are arranged parallel and at a discrete uniform distance to one another as is indicated in FIG. 2. The angle $\alpha$ a is determined from the size of the opening of the shelves 22 of the cassette 2 in the Y direction and the actual size of the required free space 5 (shaded area). In this respect, the position of the compact sensor 1 is displaceable along the axis of its objective 13 so long as the imaging scale of the objective 13 can be adapted. In this case, the inspection is carried out without impeding the handling system, without wasted time and without movement of components of the compact sensor 1 once it has been adjusted to the appropriate size of the cassette 2. In addition, the arrangement according to the invention can check the placement of wafers 3 by the handling system and, when appropriate, send signals for correcting or repeating the handling procedure.

While the foregoing description and drawings represent the preferred embodiments of the present invention, it will be obvious to those skilled in the art that various changes and modifications may be made therein without departing from the true spirit and scope of the present invention.

REFERENCE NUMBERS 1 compact sensor
11 illumination field
12 sensor array
13 objective
14 evaluating unit
2 cassette
21 webs
22 shelf
3 object/wafer
31 wafer edge
32 (imaged) edge area
33 notch
34 wafer edge
35 vertical area
4 computer
5 free space (for handling)
$\alpha$ angle (of the objective axis for surface normals of the plane of the openings of the cassette shelves)
A, B
C, d positions (of the wafer signals in the pixel rows of the sensor array)
$y_1$, $y_2$ positions (of the read out pixel rows of the sensor array)

What is claimed is:

1. An arrangement for the detection of disk-shaped objects in a cassette having a plurality of shelves, said arrangement comprising:

an illumination unit whose light is directed onto reflecting edge areas of the objects which are visible at openings of the shelves of the cassette;

at least one optical system for the transmission of light which, proceeding from the illumination unit, has been reflected in at least one edge area;

a sensor unit having at least one linear array of light-sensitive sensor elements which is oriented vertical to the direction of the shelves and to the direction of the disk-shaped objects and which converts the light reflected by the edge areas of the objects into electrical signals;

an evaluating unit for determining the presence and the position of objects in the shelves of the cassette;

said illumination unit having at least two linearly elongated rows of light sources which are arranged parallel to a family of planes predetermined by the shelves and objects and which lie in a surface parallel to the edge areas to be detected;

said optical system being an objective which is arranged between the parallel linear light sources and by which a plurality of shelves is imaged simultaneously on the sensor unit; and the array of sensor elements allowing the reading out of at least portions of an edge area of the objects which is elongated transversely to such an extent that, when imaged in the sensor plane, an irregularity present in the edge area of the object is always less than the read out portions of the elongated edge area.

2. The arrangement according to claim 1, wherein the linear light sources which are arranged parallel to the planes of the shelves are arranged symmetric to the objective in pairs.

3. The arrangement according to claim 2, wherein the linear light sources which are arranged parallel to the planes of the shelves are luminescent diode lines.

4. The arrangement according to claim 1, wherein the surface in which the parallel rows of light sources are arranged is plotted by parallel straight lines which are parallel to surface lines of a circular cylinder generated by an orderly stack of objects located in the cassette.

5. The arrangement according to claim 4, wherein the surface in which the parallel rows of light sources are arranged is a surface parallel to a tangential plane at said circular cylinder.

6. The arrangement according to claim 5, wherein the principal plane of the objective is arranged in the same parallel surface in which the rows of light sources are arranged.

7. The arrangement according to claim 4, wherein the surface in which the parallel rows of light sources are arranged is a surface parallel to a generated surface of said circular cylinder.

8. The arrangement according to claim 4, wherein a mean surface normal which coincides with the optical axis of the objective and is at the same time the axis of symmetry for the arrangement of the rows of light sources is associated with the surface in which the parallel rows of light sources are arranged and wherein this mean surface normal advantageously encloses an angle other than zero with the surface normals of a plane plotted or spanned by the openings of the cassette shelves and wherein this angle is large enough that a free space remains open in front of the openings of the shelves for the insertion and removal of objects.

9. The arrangement according to claim 1, wherein at least two parallel rows of pixels can be read out of the array of sensor elements and wherein at least two of the read out rows of pixels have a spatial distance from one another such that an irregularity to be taken into consideration in the edge area of the object when imaged in the sensor plane is always smaller than this spatial distance.

10. The arrangement according to claim 9, wherein different read out pixel rows are generated one after the other with respect to time by an individual linear array of sensor elements and wherein the sensor array is moved vertical to its longitudinal extension between the readouts of the different rows of pixels.

11. The arrangement according to claim 10, wherein the sensor array is mounted on a piezoelectric displacement element.

12. The arrangement according to claim 9, wherein a two-dimensional sensor array is provided for generating different read out pixel rows.

13. The arrangement according to claim 9, wherein means for eliminating signal dropout occurring as a result of known irregularities in the object edges are included in the evaluating unit and wherein these means correlate the object signals of at least two read out rows of pixels which are at a sufficient distance from one another in the image of the edge area and contain a logical sum for defining the presence of an object as long as there is no tolerance-exceeding difference in position of correlated object signals relative to a learned normal position of the objects.

14. The arrangement according to claim 13, wherein additional means are provided in the evaluating unit for detecting slanting of the objects over at least two shelves of the cassette, wherein an appearance of a properly loaded cassette is stored in these means by learning and a raster is provided by means of located and wherein a slanted position can be detected by means of this raster through a comparison of these defined areas with the object signals of the imaged edge areas when at least one object signal is detected outside of this defined area.

15. The arrangement according to claim 1, wherein a linear sensor array with a high aspect ratio of the sensor elements is provided for the detection of sufficiently large imaged edge areas of the objects.

16. The arrangement according to claim 15, wherein the evaluating unit contains means for calculating suitable threshold values for object signals and wherein the calculation of the threshold values is based on a calibrating measurement of the light loss in the known irregularity of the object edge in the detected edge area.

17. The arrangement according to claim 1, wherein the arrangement for detection of disk-shaped objects is provided in a multiple arrangement and wherein the individual arrangements are arranged in a row along a straight line parallel to the direction of the objects stacked in the cassette.

* * * * *